United States Patent [19]

Goodings et al.

[11] Patent Number: 5,259,033
[45] Date of Patent: Nov. 2, 1993

[54] HEARING AID HAVING COMPENSATION FOR ACOUSTIC FEEDBACK

[75] Inventors: Rupert L. A. Goodings; Gideon A. Senensieb, both of Cambridge; Philip H. Wilson, Surrey, all of United Kingdom; Roy S. Hansen, Dragor, Denmark

[73] Assignee: GN Danavox AS, Taastrup, Denmark

[21] Appl. No.: 912,125

[22] Filed: Jul. 9, 1992

Related U.S. Application Data

[63] Continuation of Ser. No. 567,370, Aug. 14, 1990, abandoned.

[30] Foreign Application Priority Data

Aug. 30, 1989 [GB] United Kingdom ............. 8919591

[51] Int. Cl.⁵ .................... H04R 25/00; H04R 27/00
[52] U.S. Cl. ........................... 381/68; 381/68.2; 381/68.4; 381/71; 381/83
[58] Field of Search .............. 381/68, 68.2, 68.4, 381/83, 84, 106, 71, 93

[56] References Cited

U.S. PATENT DOCUMENTS

| | | | |
|---|---|---|---|
| 3,920,931 | 11/1975 | Panick, Jr. | 381/68.2 |
| 4,025,721 | 5/1977 | Graupe et al. | |
| 4,052,571 | 10/1977 | Gregory et al. | 381/68.2 |
| 4,061,875 | 12/1977 | Freifeld et al. | 381/72 |
| 4,088,835 | 5/1978 | Thurmond et al. | |
| 4,185,168 | 1/1980 | Graupe et al. | |
| 4,232,192 | 11/1980 | Beex | |
| 4,396,806 | 8/1983 | Anderson | 381/106 |
| 4,405,831 | 12/1983 | Michelson | 381/68.4 |
| 4,423,289 | 12/1983 | Swinbanks | |
| 4,473,906 | 9/1984 | Warnaka et al. | |
| 4,589,133 | 5/1986 | Swinbanks | |
| 4,596,033 | 6/1986 | Swinbanks | |
| 4,600,815 | 7/1986 | Horna | |
| 4,602,337 | 7/1986 | Cox | |
| 4,636,586 | 1/1987 | Schiff | 379/390 |
| 4,661,981 | 4/1987 | Henrickson et al. | 381/68 |
| 4,669,122 | 5/1981 | Swinbanks | |
| 4,670,903 | 6/1987 | Araseki et al. | 379/411 |
| 4,689,821 | 8/1987 | Salikuddin et al. | 381/71 |
| 4,764,957 | 8/1988 | Angoline et al. | 381/68.2 |
| 4,783,818 | 11/1980 | Graupe et al. | |
| 4,791,672 | 12/1988 | Nunley et al. | 381/68 |
| 4,802,228 | 1/1989 | Silverstein et al. | 381/68 |
| 4,845,757 | 7/1989 | Wagner | 381/68 |
| 5,016,280 | 5/1991 | Engebretson et al. | 381/68 |
| 5,046,102 | 9/1991 | Zwicker et al. | 381/68 |

FOREIGN PATENT DOCUMENTS

| | | |
|---|---|---|
| 0250679 | 1/1986 | European Pat. Off. . |
| 0339819 | 11/1989 | European Pat. Off. . |
| 2633394 | 1/1978 | Fed. Rep. of Germany . |
| 2550903 | 2/1985 | France . |
| 58-114554 | 7/1983 | Japan . |
| 58-114555 | 7/1983 | Japan . |
| 58-205397 | 11/1983 | Japan . |
| 59-214341 | 4/1984 | Japan . |
| 59-103496 | 6/1984 | Japan . |
| 59-194597 | 11/1984 | Japan . |
| 8500595 | 2/1986 | Netherlands ............. 381/83 |
| 1404279 | 8/1975 | United Kingdom . |
| 2069280 | 8/1981 | United Kingdom . |
| 2088951 | 6/1982 | United Kingdom . |
| 2142091 | 1/1985 | United Kingdom . |

OTHER PUBLICATIONS

"Measurement and adaptive suppression of acoustic feedback in hearing aids", by D. K. Bustamante et al, ICASSP, Glasgow, Scotland, May 23-26, 1989, pp. 2017-2020.

Primary Examiner—Jin F. Ng
Assistant Examiner—Jason Chan
Attorney, Agent, or Firm—Richard M. Goldberg

[57] ABSTRACT

A hearing aid includes a filter in an electrical feedback path, the characteristics of which filter are calculated to model acoustic coupling between the receiver and microphone of the aid. A limiter is inserted in the main electrical pathway between the microphone and the receiver to provide stability in the presence of sudden sound bursts. A noise signal is injected continuously into the electrical circuit and is used to adapt the characteristics of the filter to accommodate changes in the acoustic coupling. The level of the noise signal can be varied to match changes in residual signal level to maintain signal to noise ratio and to optimize rate of adaption commensurate with satisfactory hearing function while the noise itself is unobtrusive to the user.

17 Claims, 6 Drawing Sheets

HEARING AID HAVING COMPENSATION FOR ACOUSTIC FEEDBACK

This application is a continuation of application Ser. No. 07/567,370, filed Aug. 14, 1990, now abandoned.

BACKGROUND OF THE INVENTION

1. Technical Field

The present invention concerns improvements in or relating to hearing aids and more particularly hearing aids such as for example "in-the-canal" (ITC), "in-the-ear" (ITE), and "behind the ear" (BTE) hearing aids which share the common feature that the microphone and receiver components thereof are mounted on a single body and are closely spaced.

A number of mechanisms can contribute to the acoustic feedback that occurs in these aids. In all cases there will occur an unavoidable acoustic or mechanical coupling through the body or the inner volume of the hearing aid. Acoustic feedback will also occur as sound is directed by reflection and is channelled from the receiver to the microphone. Thus in the case of "behind-the-ear" aids sound can be reflected by the surrounding head structures and in the case of "in-the-canal" and "in-the-ear aids" acoustic coupling can occur through an unintended aperture around the periphery of the mould of the hearing aid.

In the case of "in-the-ear" hearing aids, venting is included as a means for reducing occlusion—that is to say, to avoid a blocked ear sensation. A further benefit of including venting is that it allows the direct input of unamplified low frequency sound into the ear—an important benefit for those patients that suffer a high frequency loss with only minor loss at low frequency and who have therefore no need for amplification in this lower frequency range. There is also available a wide range of vent sizes. Whilst larger diameter vents are more effective for reducing occlusion than vents of smaller diameter, they also give rise to an increase in acoustic feedback. Vent sizes are thus limited by the attendant need to avoid excessive acoustic feedback. Large sizes of vent now are used infrequently and are limited in application to aids using only lower gain amplification.

A number of problems are associated with acoustic feedback. The most commonly considered is the occurrence of oscillation. This occurs at high gain level and is usually persistent. At gain settings just below those that cause such oscillation "ringing effects" are perceivable. This latter causes further unpleasant sensation and reduces the intelligability of speech and other wanted sound. An additional effect is that the acoustic feedback contributes to gain dependant perturbations in the frequency response of the hearing aid. Such uncontrolled frequency response effects occur at gains well below the onset of oscillation and can cause quite discernable, and sometimes considerable, distortion in the perceived sound, and accordingly do reduce the effectiveness of the hearing aid in meeting prescribed characteristics.

2. Reference to Prior Art

It is difficult to avoid the occurrence of acoustic feedback. Thus in the case of "in-the-ear" aids leakage can be reduced by making the ear mould a tighter fit. This however is hard to achieve and is far from ideally comfortable for the user. It is also not possible to eliminate internal acoustic feedback. In both cases however it is possible to reduce the level of acoustic feedback by careful positioning of the components, particularly the direction and position of the microphone port.

Since the elimination of acoustic feedback is not possible, effort has been directed to suppress the occurrence of oscillation. The frequency response of hearing aids means that oscillation usually occurs at frequencies in the range 1 to 4 kHz and the exact frequency is set by the normal Nyquist conditions (i.e. loop gain that is greater than zero decibels and zero phase difference between wanted signal and echo).

Oscillatory conditions may be suppressed by the user turning down the volume control, i.e. reducing gain, once oscillation has occurred. This however is generally inconvenient to the user. Therefore techniques have been developed for preventing the occurrence of oscillation. Thus the electronic gain of an aid has been reduced for frequencies where oscillation is likely to occur. This however means that the prescribed high frequency response for a deaf user would be compromised deliberately at these high frequencies which are usually in the range 1 to 4 kHz and also quite near to the natural resonant frequency of the ear canal of about 3 kHz. Also receivers have been designed to reduce their electro-acoustic gain particularly at the resonant frequency of the receiver where a relative gain figure of 10 decibels or more can occur. However, this peak is normally desirable so as to reproduce the natural canal resonances of a normal ear.

In all cases of oscillation avoidance considered above it will be noted that a design compromise is necessary and that in consequence such hearing aids can only offer a sub-optimum performance to the user.

Other corrective techniques have involved the detection of the onset of oscillation and the provision of cancellation or other compensation in response. Thus a detected signal has been used as a means of controlling an automatic gain stage. An alternative technique is to use the detected signal to control the generation of an internal oscillation and to use the latter to cancel the unwanted oscillation. This technique has to be adaptive since the oscillation frequency and amplitude will vary according to changes in external conditions. Furthermore the detected signal has been used to adjust the centre frequency of a notch filter, that is to say a filter with a frequency selective reduction in gain centered at or near the oscillation frequency.

In the above techniques involving oscillation detection however no compensation is provided for the effects of acoustic feedback at those frequencies remote from the oscillation frequency.

An alternative approach to the above is proposed in U.S. Pat. No. 4,783,818. As proposed the effects of acoustic feedback are compensated by electrical negative feedback. The negative feedback path includes a filter the characteristics of which are modeled on those identified inter alia for the acoustic feedback path itself. The communication system described, which may be for example a hearing aid, is constructed to have two time consecutive modes of operation: an ordinary operational mode; and an identification mode. In the ordinary operational mode the compensated electrical signal is fed through an amplifier and thereon used to energise the receiver. In the identification mode, which may be selected e.g. at turn-on or in response to an automatically sensed threshhold change in amplifier gain, the amplifier is decoupled from the circuit and a correction circuit is substituted. The correction circuit includes a source of noise for example pseudo-randombinary-sequence signals and parameters associated only with acoustic feedback are identified and used to define the transfer function of the filter that is then subsequently used during ordinary operation. It is a disadvantage of this construction however that during the identification mode of operation the hearing aid behaves as a generator of acoustic noise and does not provide any effective hearing aid operation at all. Also ordinary operation is only satisfactory so long as the acoustic feedback remains substantially the same as that for which the parameters are identified. The proposed construction therefore is not entirely satisfactory for hearing aid application.

This type of approach has also been considered experimentally. See the following thesis entitled "Digital Suppression of Acoustic Feedback in Hearing Aids" by Leland C. Best, University of Wyoming, May 1985. In this are described several experiments on an adaptive digital filter applied as a continuously adaptive feedback path to compensate for acoustic feedback in the hearing aid. A digital random number generator using the congruence method is employed as the source of noise which is injected into the acoustic path for deriving adaptively the filter parameters.

The experimental apparatus described in this thesis does not form a practical hearing aid. This is principally because of the problem of non-linearities in the feedback, as described in Chapters IV and VI of this reference. Such non-linearities become manifest when the output signal momentarily exceeds the linear region of the response of the output transducer. Under these circumstances the digital filter is no longer able to produce an accurate replica cancelling the feedback signals. Since the digital filter would generally be employed to enhance the gain of the hearing and, it would be quite common for both the acoustic path and the digital filter path each to be unstable when separate, only stabilising each other by producing accurate replicas of each others feedback signals. At the onset of non-linearity as described the feedback signals in the two parts no longer cancel each other and both parts become unstable. The hearing aid therefore becomes unstable, and may remain so indefinitely.

In Chapter IV of this reference, this problem is solved for experimental purposes by detecting that this situation is likely to have occurred, and silencing the transmission of output signal until this system recovers. This is performed for example by ramping down the amplifier gain to zero. See pages 26 to 28 of this reference. Such a solution would not be acceptable in practice however since it would result in fairly frequent interruptions of the amplified sound.

SUMMARY OF THE INVENTION

The present invention is intended to provide a remedy to the problems aforesaid.

It is an object of the present invention to provide compensation for acoustic feedback occurring due to unavoidable acoustic coupling between the receiver and microphone of the hearing aid.

It is a further object to provide operational stability for the hearing aid in the presence of abrupt and transient increases in the level of ambient sound.

It is a preferred object of the invention to provide adaptive change in such compensation to accommodate temporal changes arising in the acoustic coupling between the receiver and the microphone.

It is a further preferred object of the invention to provide such adaptive change without any interruption of hearing aid function.

It is yet a further preferred object of the invention to provide such adaptive change in continuous response to the temporal changes arising in the acoustic coupling aforementioned.

According to the present invention, there is provided a hearing aid in which acoustic feedback between receiver and microphone is electrically compensated by applying an electrical feedback signal to an electrical path including an amplitude limiting device between the microphone and the receiver, the amplitude limiting device being arranged such that the receiver shall not enter its non linear region of operation which is outside of the amplifier-receiver upper and lower linearity limits, the electrical feedback signal being derived by extracting an electrical response signal from the electrical path after the output of the amplitude limiting device and passing the same through a filter the characteristics of which are calculated to model acoustic coupling between the receiver and the microphone.

The present invention provides for practical application of a feedback cancellation by the deliberate inclusion in the electrical output path of a device which has such performance characteristics as will ensure that the signal is prevented from reaching the non-linear region of the transducer response. The device is included in the circuit in such a location as it can effect the signal applied both to the output transducer and to the cancellation network so as to ensure that the signal input to the cancellation network is at all times representative of the acoustic signal emanating from the transducer. Both the acoustic path and cancellation path thus operate in their respective linear regions and non linear oscillations are avoided. The need to interrupt the transmission of amplified sound is thereby eliminated.

BRIEF DESCRIPTION OF THE DRAWINGS

In the drawings accompanying this specification.

DETAILED DESCRIPTION OF THE PREFERRED EMBODIMENTS

Embodiments of the invention will now be described and reference will be made to the drawings. The description that follows is given by way of example only.

Figure 1:
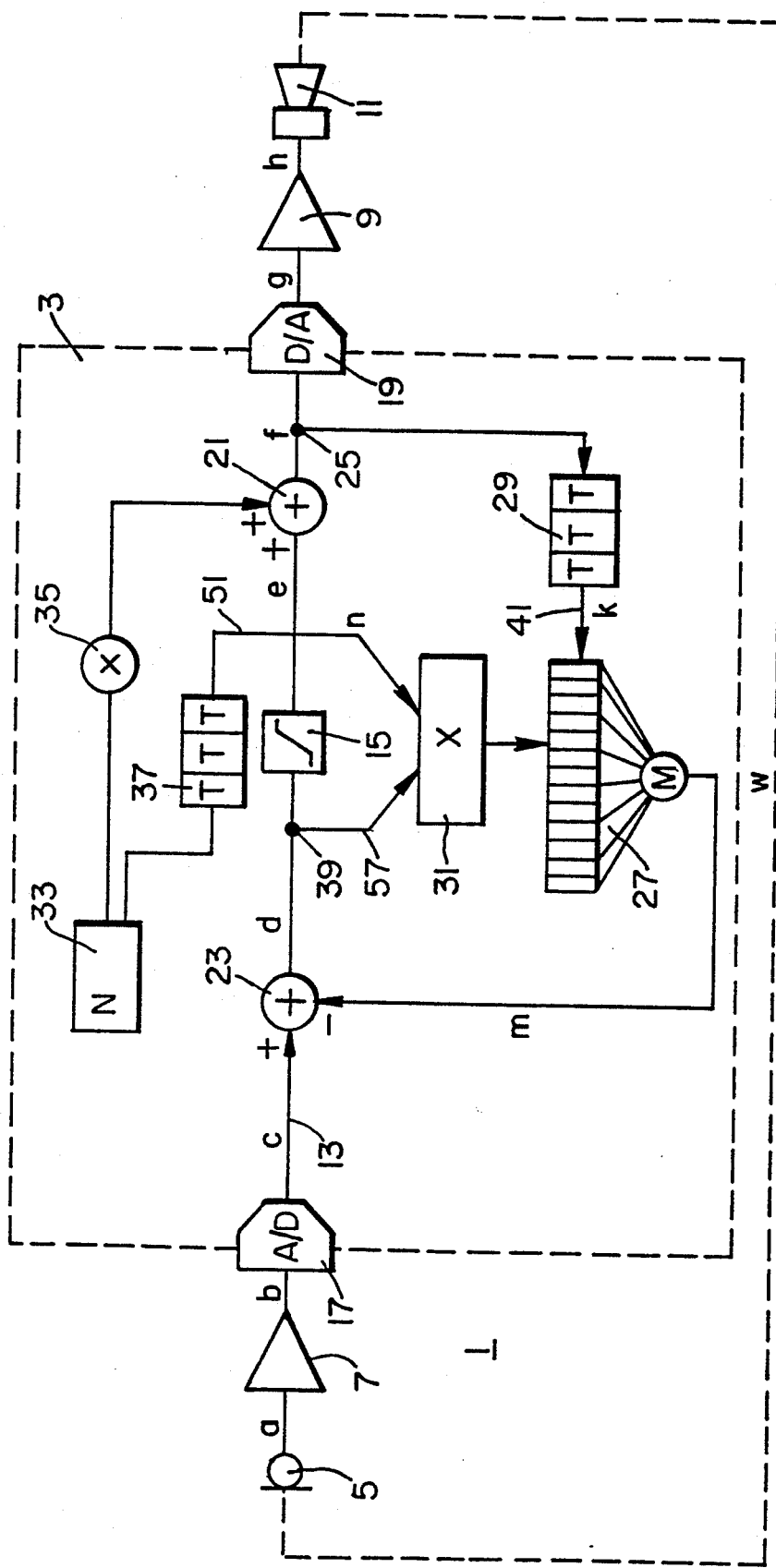
FIG. 1 is a block circuit diagram of a hearing aid having provision for adaptive electrical feedback.
Figure 4:
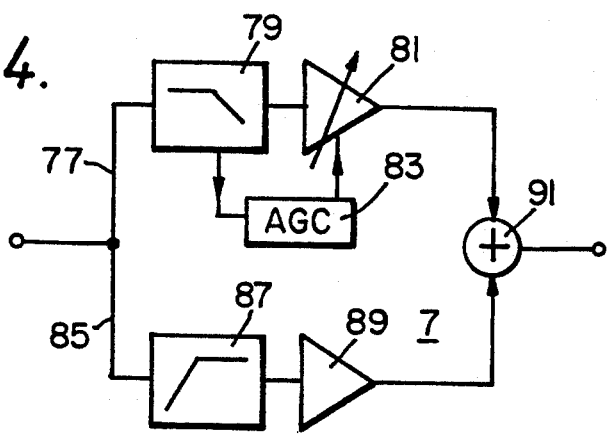
FIG. 4, is a block circuit diagram for an amplifier including automatic gain control.

In FIG. 1 there is shown a hearing aid 1 which but for the inclusion of an adaptive circuit 3 is otherwise of conventional design and comprises an acousto-electric transducer—i.e. a miniature microphone 5—a preamplifier 7; a main amplifier 9; and an electro-acoustic transducer—i.e. a receiver 11. The preamplifier 7 may be constructed as shown in FIG. 4 to provide a compensation for excessively loud speech signal such as that eminating from the user of the hearing aid. In one path 77 of this amplifier there is included a low pass filter 79 and a first amplifier 81. The gain of this first amplifier 81 is controlled by means of an automatic gain control circuit 83. In the other parallel path 85 of the preamplifier 7 there is included a high pass filter 87 and a second amplifier 89. The signals from each of the amplifiers 81 and 89 are summed at a summing node 91. In the connective electrical path 13 between the preamplifier 7 and the main amplifier 9, a limiter 15 is inserted so as to prevent the electrical signal reaching an amplitude level exceeding the amplifier-receiver upper and lower linearity limits of each of the main amplifier 9 and the receiver 11. In the arrangement of conventional components and limiter thus far described the acousto electric gain of the microphone 5, the gain of the preamplifier 7, the gain of the main amplifier 9, and the electro-acoustic gain of the receiver 11 are all designed to have a suitable spectral response so that the insertion gain of the hearing aid conforms (matches) as near as is possible to prescriptive requirements.

For general convenience the adaptive circuit 3 has been constructed using an all digital implementation. The construction of the adaptive circuit 3 however is not restricted to the details of the design shown and mixed digital-analogue and/or analogue implementations are not precluded.

The input of the adaptive digital circuit arrangement 3 is interfaced to the preamplifier 7 by an analogue to digital converter 17. At its output the digital adaptive circuit 3 is interfaced to the main amplifier 9 by a digital-to-analogue converter 19. The limiter 15 is also of digital construction (FIG. 5) and is located in the connective path between the analogue-to-digital converter 17 and the digital-to-analogue converter 19. The signal at the input to the limiter 15 is compared in parallel by means of comparators 97 and 99 and the output signal of each of these comparators 97 and 99 is used to operate serially connected multiplexers 101 and 103. When the signal is within the set limits the signal is passed through the two multiplexers 101, 103 to the output. If however one or other of the limits is exceeded the signal is locked and one or other of the limit value signals passed to output by the multiplexers 101, 103. A summing node—a digital adder 21—is interposed in the electrical connective path between the limiter 15 and the digital-to-analogue converter 19. This digital adder 21 is to provide a node for the injection of a noise signal N as will be described hereinbelow. Of course, it will be recognized that the limiter upper and lower linearity limits of limiter 15 must lie within the amplifier-receiver upper and lower linearity limits, and the limiter upper and lower linearity limits differ from the amplifier-receiver upper and lower linearity limits by an amount at least equal to the level of the noise signal N. A subtractive node—a second digital adder 23—is inserted in the main path between the analogue-to-digital converter 17 and the limiter 15. This latter digital adder 23 is provided as a means for introducing electrical feedback which also will be described hereinbelow.

The normal signal path for wanted signals from the microphone 5 to the receiver 11 is the direct path a-b-c-d-e-f-g-h as shown. It will be noted that the path elements a, b, g and h are analogue and thus provided by single conductors. Direct path elements c, d, e and f however are all digital and will thus comprise each a number of parallel conductors. Each path element could have for example between 8 and 12 parallel conductors according to the bit resolution of the analogue-to-digital converter 17.

Electrical feedback is extracted by means of a tap 25 on section f of the main path, that is to say the section between the digital summer 21 and the digital-to-analogue converter 19, i.e. the electrical feedback signal taken from this tap includes an injected noise signal component. The tapped electrical feedback signal is passed through an adaptive filter 27, as shown here a finite impulse response (FIR) filter, and after passage through this filter 27 it is applied to the subtractive digital adder 23. For convenience, in this arrangement the digital signal from the tap 25 is passed through a delay line 29 before reaching the filter 27. The delay time of this line 29 is designed to model the minimum acoustic transit time between the receiver 11 and the microphone 5.

The inclusion of this delay line 29 is not essential but it avoids redundancy in filter and correlator stages. The finite impulse response filter 27 is adaptively controlled by multiplicative coefficients derived using a correlator 31. The correlator 31 looks for a correlation between the injected noise signal N and any noise component in the residual signal formed at the output of the subtractive node, i.e. the digital adder 23. The injected noise signal N is generated using a source 33 and is injected into the main signal path using the summing node, digital adder 21, after attenuation via a multiplier 35. The noise signal is also connected to a reference input of the correlator 31 and is passed to this via a second delay line 37 which also inserts a time delay corresponding to the minimum acoustic transit time already described. The residual signal which is applied to the signal input of the correlator 31 is taken from a tap 39 on the digital section d of the main path, that is the main path between the subtractive node digital adder 23 and the digital limiter 15.

A copy of the electrical output signal at tap f is thus passed through the delay 29 into the adaptive Finite Impulse Response (FIR) filter 27. This filter is arranged to produce the adaptive feedback signal.

This adaptive feedback signal is subtractively summed with the input signal. In ideal operation the adaptive feedback signal will be arranged to be equal in all respects to the unwanted acoustic feedback that occurs as a result of the mechanisms described earlier (the acoustic feedback is denoted by a dotted line w in FIG. 1).

If the adaptive feedback signal and the input signal to the digital adder 23 are equal then the output of the digital adder 23 contains no residual feedback because the two components will exactly cancel each other.

In order to adapt the filter 27 so that it produces an exact replica of the electrical signal corresponding to the acoustic feedback, the noise signal N, after attenuation via the multiplier 35, is added to the output signal and is used to excite the receiver 11. Note that the noise signal appears in both the internal (adaptive) and external (acoustic) feedback paths, so that in ideal operation noise feedback will be completely cancelled at the digital adder 23 so that the residual signal on line d contains no injected noise.

It will be noted that the noise signal N injected into the main signal path at the summing node 21 passes through the digital-to-analogue converter 19 and thence through the main amplifier 9 and the receiver 11. At the receiver 11 it is converted to produce an acoustic signal. This signal is superimposed upon the wanted signal. The level of the noise signal produced at the output of the multiplier 35 is therefore so chosen that the acoustic level of the output of the receiver 11 is unobtrusive to the user. Since correlative techniques are used and these are very sensitive, it is possible to use an extremely low level of noise signal, indeed one that is little higher than (i.e. within a few dB above) the white noise level of the hearing aid itself. For practical use a very efficient adaptation behaviour can be obtained by using a constant signal/noise ratio. The level of injected noise is continuously adjusted to be a certain number of dB lower than the signal and therefore unobtrusive to the ear. A high level of noise relative to the signal gives a very fast adaptation. This instantaneous signal/noise ratio can be say between 12 and 24 dB with 12 dB being suitable for persons with severe hearing losses requiring very high gain. 24 dB would result in somewhat slower adaptation, but with a noise level practically imperceptible to a person of near normal hearing requiring more moderate gain levels.

In practice, the internal (adaptive) feedback and the external (acoustic) feedback do not completely cancel and a small amount of noise (and other feedback components) appear as finite residual signal. The noise component of this residual signal is detected by the correlator 31 which usually operates continuously, looking for long term agreement between the residual signal and a delayed version of the generated noise. The output of the correlator is an estimate of the residual noise in the signal, and it is used to directly adapt the filter 27. The adaption sign is choosen to adapt the filter 27 to produce lower residual noise so that the system tries to converge to a situation where the noise is cancelled. The dynamic nature of the environment, and practical algorithm limitations mean that perfect convergence is not generally achieved. However, given careful optimisation high levels of cancellation are possible.

Figure 8:
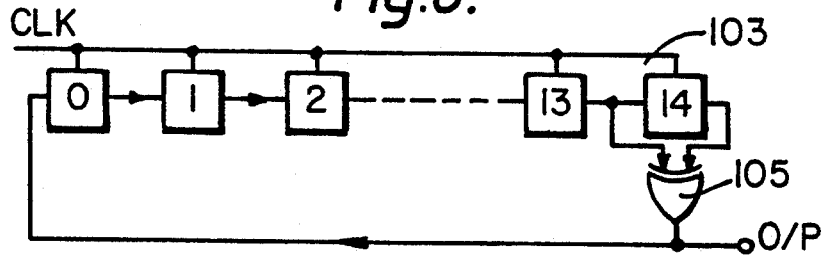
FIGS. 8 and 9 are block circuit diagrams of a pseudo-random-binary-sequence generator and a variant thereof.

By arranging the noise to provide a satisfactory spectral characteristic, that is a flat level over a bandwidth comparable to that of the hearing aid, the adaption of a system for minimum noise components in the residual noise signal also corresponds to minimum residual feedback of all other signals. It has here been shown that pseudo-random-binary-sequence p.r.b.s. signals of appropriate bit repetition lengths can serve as satisfactory noise signal. Such pseudo-random-binary-sequence signals can be readily generated (FIG. 8) using a clocked shift register 103 with multiple feedback via an exclusive OR-gate 105. Such configured registers produce signals with a pattern repeating after every $2^M-1$ bits where M denotes the number of register stages. Satisfactory performance has been obtained for sequences of length 127 bits and 37,267 bits (i.e. using registers having 7 and 15 stages respectively). Other spectrally balanced sequences (including other lengths of p.r.b.s.) are also expected to work.

Figure 9:
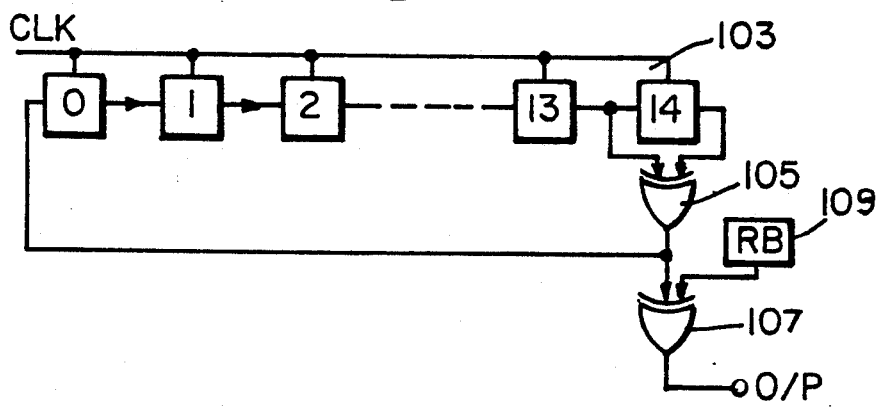

Whatever the choice of noise signal it should have a low autocorrelation over any time span which is of the same order of magnitude as the adaption time constant, typically a second. The pseudo-random bit sequence generator described has the advantage of being simple to implement and also is suitable for miniaturisation. It is noted however that it is a disadvantage of such a simple device, particularly when a low order pseudo-random bit sequence is employed, that it has a low repetition period. This can be a problem when the ambient acoustic signal is highly periodic—for example a long duration constant frequency sine wave signal. Spurious correlations with the injected signal may then occur and cause the adaption process to wander, leading to undesirable audible effects. These effects can be eliminated by providing a further randomisation of the pseudo-random bit sequence. This is shown for example in FIG. 9 where the signal at the output of the p.r.b.s. generator 103, 105 is gated by a second exclusive OR-gate 107 whose other input is connected to a source 109 of a randomising binary signal, for example it may be connected to the least significant digital output of the anlogue digital converter 17 of the hearing aid. This has the effect of randomising the bit sequence further, and thus of eliminating the wandering effect.

It will be noted that by reducing cancellation of feedback over a broad range of frequencies, not just a small range of frequencies where oscillation can occur, all of the effects of the acoustic feedback can be removed. Thus it would be normally ensured that the noise signal has a flat level characteristic over the range 300 Hz to 7 kHz, the conventional bandwidth of a hearing aid.

Where only avoidance of oscillation is requisite however a noise signal having a flat spectral characteristic over a more limited range covering the expected range of oscillation frequencies normally would be adequate.

Figure 2:
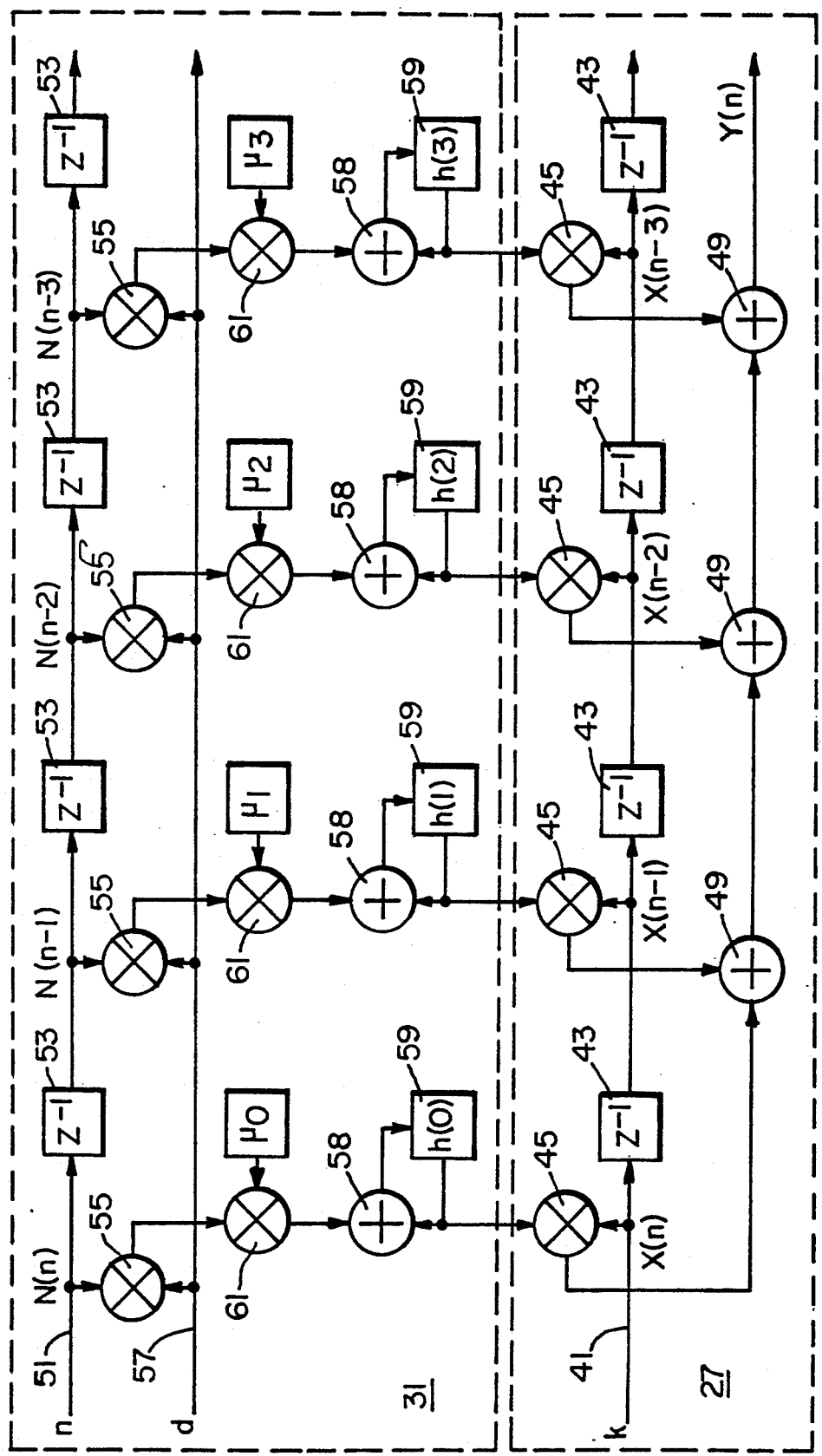
FIG. 2 is a block circuit diagram of adaptive components used in the above modified hearing aid.

The correlator 31 and FIR filter 27 are shown in more detail in FIG. 2

The FIR filter 27 is of standard digital filter architecture. It comprises thus: a delay line 41 having a number of delay stages 43; a first multiplier 45 preceding the first one of the delay stages 43 and a multiplier 45 following each delay stage. The multipliers 45 are all connected in parallel to the input of a digital adder 49.

The input signal on digital lines k of the output of the delay line 29 is passed through the series of delay stages 43 to provide a series of sequential samples x (n), x (n−1), x (n−2) . . . etc where x (n) is the most recent digital sample of the signal. Each sample is delayed one period of the master clock operating the analogue-to-digital converter 17 and the digital-to-analogue converter 19. Typically, for an in-the-ear aid (ITE) the upper band limit would be designed to be on the order of 7 kHz. For this the master clock frequency would need to be at least 14 kHz (Nyquist) and in practice a frequency of at least 20 kHz would be chosen. For a behind-the-ear aid the band width would be in any case somewhat lower since the communicative tubing used in its construction acts as a low pass filter. In such case a lower master clock frequency of say 10 kHz would then be more appropriate. A master clock oscillator including a switched capacitor filter could be used and could be preset to provide a master clock frequency of either 10 kHz or 20 kHz as requisite. The common circuit design may then be implemented. It is noted that although the higher clock frequency of 20 kHz could also be used for the BTE aid, by using a lower sample rate advantage is taken of the fact that the correlation is performed over a greater time span for a given number of delay stages. Thus performance can be improved or alternatively a similar performance achieved using a smaller number of correlator stages. The signal samples are individually multiplied by a series of multiplicative coefficients h(0), h(1), h(2) . . . , etc., and the resulting products are summed by the digital adder 49 to produce a single output y (n). This operation is summarized by the formula:

$$y(n) = \sum_{m=0}^{N-1} \{h(m) * x(n - m)\}$$

In this arrangement each of the coefficients h(m) is updated on each cycle of the master clock and a new output y (n) is calculated.

Adaption operates by adjusting the values of the coefficients h(m) in a controlled manner. A correlator 31 designed to do this is also shown in FIG. 2. This correlator 31 is designed to adapt the filter 27 according to the Widrow-Hoff algorithm (see B. Widrow et al., "Stationary and non-stationary learning characteristics of the LMS adaptive filter," Proc. IEEE Volume 24 pages 1151-1162, August 1976). In applying this algorithm each coefficient h(m) is adjusted every cycle. The adjustment is a simple increase or decrease in the value of the coefficient h(m) the magnitude and the sign of which are determined by the action of the correlator. Each coefficient h(m) is accumulated independently.

The correlator 31 comprises a delay line 51 having a number of single bit delay stages 53. The number of these stages is the same as the number of stages 43 incorporated in the FIR filter 27 just described. The input to the delay line 51 and the output from each of the single bit delay stages 53 is connected to the reference input of a corresponding digital multiplier 55. The second input to each of the digital multipliers 55 is connected to a common set of digital lines 57. The delay line 51 is connected to receive noise signal N from the noise source 33 and delay line 37, whilst the common set of lines 57 is connected to tap 39 so as to receive the residual signal. The output of each multiplier 55 passes to an adaptation rate scale factor multiplier 61 and the product term is either added, by an adder 58, to an accumulated coefficient held in an accumulator . register 59. The amplitude of this added term differs from the amplitude of the residual signal by an adaption-rate scale factor. The sign of this term, i.e. whether it is added or subtracted, depends upon the signs of the noise and residual signal being the same or different respectively.

The process is simplified by combining the long term averaging that is required for correlation into the coefficient accumulators. This is realised by extending the resolution of the coefficient accumulators 58-59, so that several successive correlation inputs are required before the accumulated input becomes significant to the filter 27. Thus in the construction shown each coefficient accumulator 59 is 24 bits in length of which only the most significant 12 to 14 bits are used to define the multiplicative coefficients h(m) used in the FIR filter 27. The ratio of maximum correlator input to filter significance determines the adaption rate. It is a property of the chosen adaption algorithm described above that the adaption will vary as a function of signal level. In this preferred arrangement the adaption is continuous since the multiplicative coefficients are updated upon each master clock cycle. The adaption rate should therefore be carefully chosen to get an acceptable compromise between the rate of adaption from cold (or following an abrupt change in sound signal or in ambient conditions) and the degree of convergence (i.e. stability of the system) when after a settling period the conditions are stable. It is a drawback of the correlator thus far described that when it is designed to optimise the degree of convergence, i.e. long term stability, the settling period from start up can be somewhat excessive. As an improvement therefore a modification is provided to impose additional variation of the adaption rate. Thus in FIG. 2 the correlator 31 is modified by the insertion of a second multiplier in each stage between the first multiplier 55 and the corresponding coefficient accumulator 59. Each second multiplier 61 has an input to receive a scaling coefficient $\mu$. The signed residual signal produced at the output of each first multiplier 55 is thus scaled by a multiplicative factor $\mu$ before it is passed on to the corresponding coefficient accumulator 59 for each consecutive stage of the correlator 31. Various techniques are thus possible to optimise the above trade-off between rate of adaption from cold (or an abrupt change in conditions) and the degree of convergence when conditions are stable. The preferred implementation thus uses an imposed variable rate of adaption. In practice it has thus been found that better performance is achieved by imposing a high rate of adaption when the hearing aid and thus correlator 31 are first switched on (i.e. from cold) followed by a lower imposed rate of adaption after a predetermined settling period, the latter for achieving long term stability. To implement this the multiplicative scaling coefficients $\mu$ are first assigned a common high value and after a predetermined settling time the coefficients $\mu$ are abruptly changed to a common second lower scaling value. Circuit components for generating the scaling coefficients $\mu$ thus may include a time measuring detector e.g. a counter that is triggered by the master clock. This then will accommodate the need for rapid adjustment of the multiplicative coefficients $\mu$ that are fed to the FIR filter 27 immediately following start-up. In order to accommodate not only rapid adjustment of the coefficients h(m) following start up but also rapid adjustment of the coefficients h(m) following an abrupt change in conditions long after start up, the counter could instead be triggered using a discriminator that is responsive to the level of the residual signal. Such implementations have proved to be altogether quite adequate. In the foregoing modification to the correlator 31 the scaling coefficients $\mu$ are changed step-wise between two values, a high value and a low value respectively. Other techniques of optimisation however are not precluded. In a more complex variant using an alternative design of counter the scaling coefficients $\mu$ may be changed from a high value to a low value by gradual transition through a series of decreasing values. In both the foregoing modifications discussed the scaling coefficients $\mu$ for each of the stages of the correlator 31 are changed in unison. It is also noted that when conditions are very stable no adaption would be required and updating of the accumulated coefficients could be inhibited by setting the scaling coefficients $\mu$ to zero for all stages of the correlator 1.

Instead of the foregoing, the adaption rate could be varied by changing the level of the injected noise. This may be implemented, for example, by controlling the level of the injected noise to vary as a function of the level of the audio signal. Provided that this is done keeping the ratio of signal to noise more or less constant, the net noise output whilst audible would be quite unobtrusive. Further details will be given below.

Figure 11:
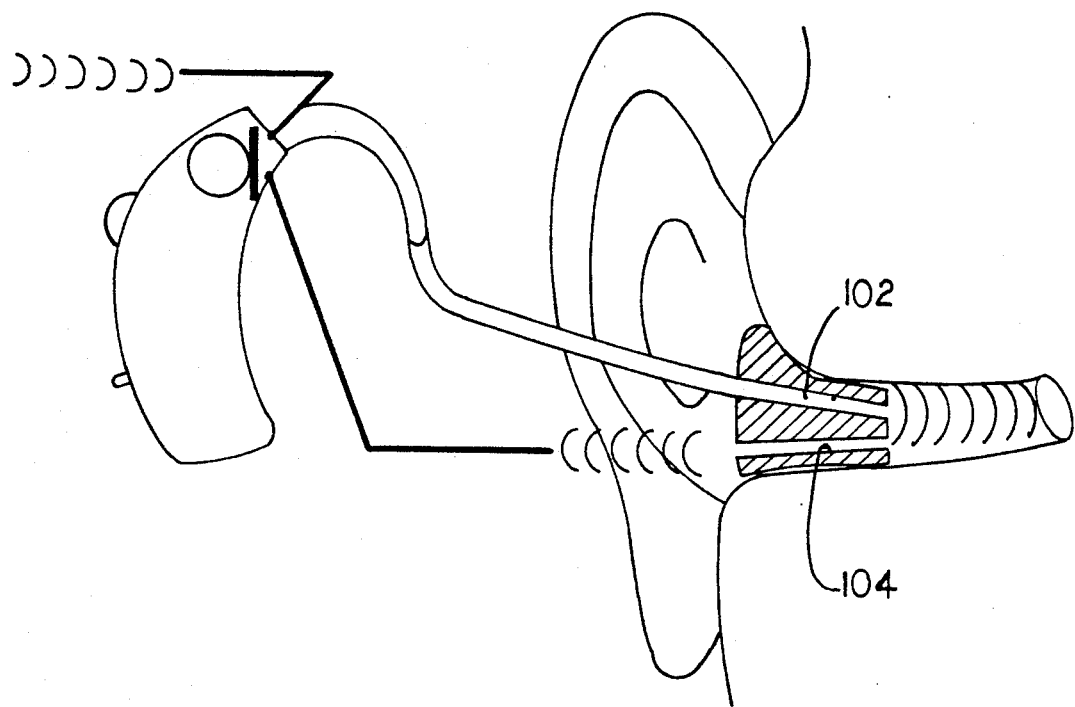
FIG. 11 is a schematic view of a vented hearing aid for use with the present invention.

The embodiment and its variants described above may be implemented as part of the internal circuitry of a hearing aid. The Widrow-Hoff algorithm is highly efficient. The circuitry therefore is particularly appropriate to the construction of "behind-the-ear" "in-the-ear" and "in-the-canal" aids where low power operation is required. The present invention may be used in a vented hearing aid, as shown in FIG. 11, having first and second passageways 102 and 104, the second passageway 104 being open at both its ends to provide venting for the ear when the molding of the hearing aid is fit in the ear.

Figure 6:
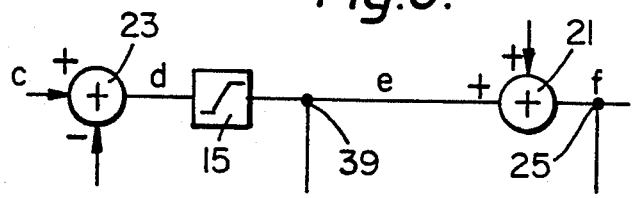
FIGS. 6 and 7 are block circuit diagrams illustrating alternative positions for the limiter used in the aid of FIGS. 1 and 3 above.
Figure 7:
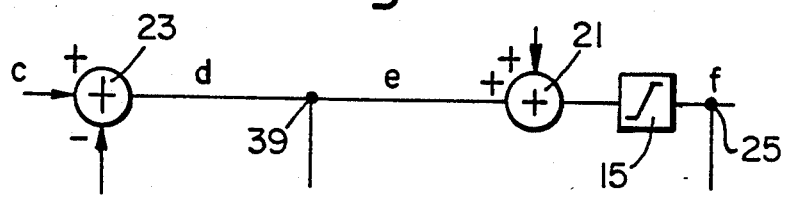

The limiter 15 described above is located as shown in FIG. 1 between the correlator input tap 39 and the injection node 21. This position is optimum. However as an alternative to the above it could be located at other positions between the feedback injection summing node 23 and the feedback input tap 25. These alternative two positions are shown in FIGS. 6 and 7. In FIG. 6 it is shown located between the feedback signal injection summing node 23 and the correlator input tap 39. For this location however signal clipping results in a loss of information about the noise that has been added and this results in a slow down of the adaption. Similarly when the limiter is located between the noise injection summing node 21 and the feedback input tap 25 the injected noise is limited and again the adaption is slowed down.

Figure 3:
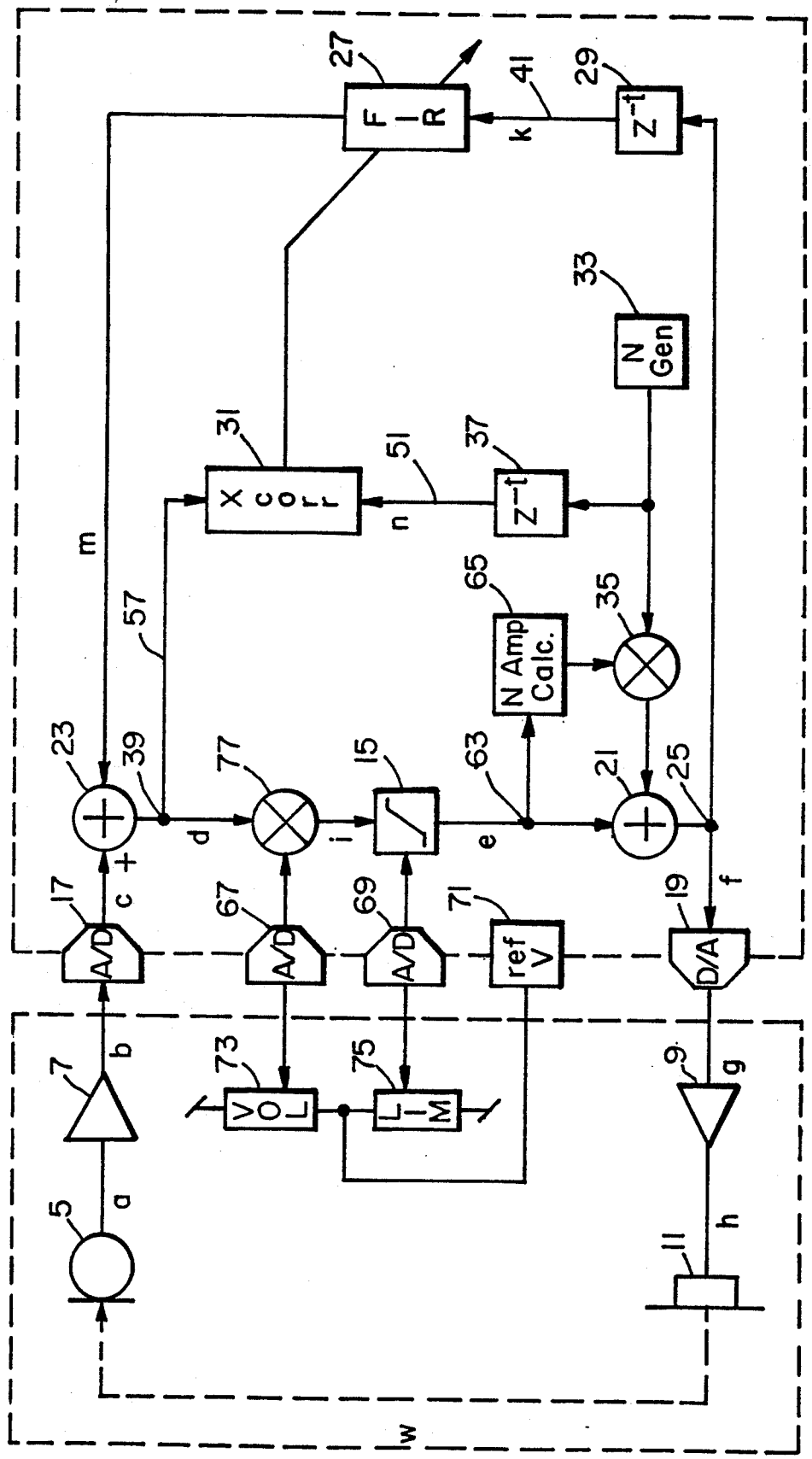
FIG. 3 is a block circuit diagram of a hearing aid a modification of the aid shown in FIG. 1.

Further refinements of this hearing aid are shown in FIG. 3. This refined embodiment includes a user controlled volume control and also provides for external variation of the limitation levels for the limiter. Provision is also made for signal to noise level control and also for preset adjustment by the user.

In a practical hearing aid it is desirable to have a volume control which can be user controlled. This can be placed in the microphone amplifier or before the output amplifier, but in both cases the adaptive filter must change its coefficients when the volume control is adjusted. If however the volume control is placed after the subtraction of the anti-feedback signal and before the limiter neither the maximum output nor the coefficients need to change when the volume control is adjusted. In the adapted arrangement shown in FIG. 3 a multiplier 77 is inserted between the correlator input tap 39 and the limiter 15. The control for the multiplier 77 is provided by a user controlled volume control potentiometer 73 and an A/D converter 67.

Figure 5:
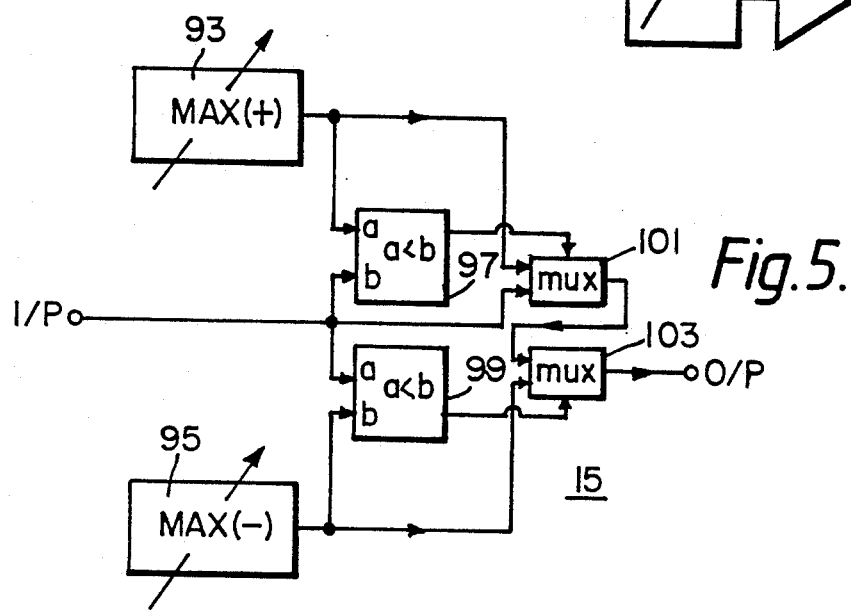
FIG. 5 is a block circuit diagram for a limiter such as that used in the circuits of FIGS. 1 and 3 above.

The limits for the limiter 15 could also be user controlled. This is desirable because the limiter determines the maximum sound pressure level which is able to occur in the user's ear. This is a significant feature because the maximum output can be reduced or altered without reducing or altering the gain of the amplifiers. As shown in FIG. 5 the maximum positive and negative limits 93, 95 for the limiter 15 are provided by a user controlled potentiometer 75 and an A/D converter 69. In the simple arrangement shown the volume control and limit control potentiometers 73, 75 are connected to a common source 71 of a reference voltage.

One or more filters would normally be included to modify the spectral response according to prescriptive requirements. Preferably in the hearing aid circuit shown in either FIGS. 1 or 3 this is implemented digitally using one or more FIR or IIR filters. It is preferable to locate such a filter or filters between the limiter 15 and the feedback cancellation signal node 23. Such filters would usually introduce added delay, but if placed in this preferred location it is not necessary to add extra delays in the feedback cancellation loop. This would be necessary if the filter were placed to immediately precede the digital to analogue converter 19.

Due to the limited length of the feedback cancellation FIR filter used in the embodiments described, the possible cancellation grows with the frequency, and is therefore most effective in hearing aids with a relative high gain at the higher frequencies. With some kinds of hearing loss it is desirable to reduce the high frequency gain, because the user's residual hearing at loss of frequencies is useless. Inevitably this kind of filtering will reduce the effect of feedback cancellation. A solution is to reduce the sampling frequency. This requires however that the anti-aliasing filter cut-off frequency tracks the sampling frequency. This could be done with a switched capacitor filter coupled to the A/D converters 17, 67 and 69.

Figure 10:
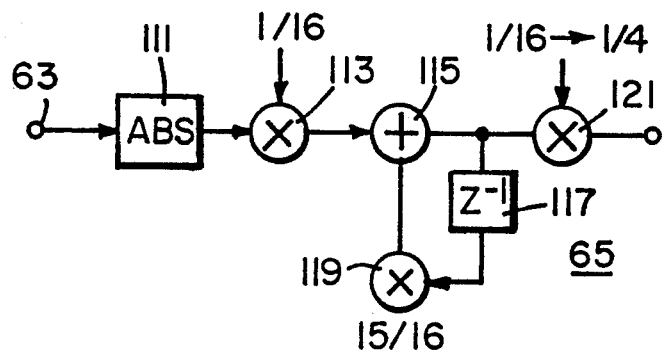
FIG. 10 is a block circuit diagram of a noise level control circuit for use in the hearing aid shown in FIG. 3.

As already mentioned above the noise level may be controlled to provide optimal rates of adaption. As shown in FIG. 3 the multiplier 35 following the noise generator 33 is controlled by a computational unit 65, for example, a first order recursive filter. This may have the form of a single stage recursive filter such as that shown in FIG. 10. The input to this computational unit 65 is taken from a point 63 in the main part between the correlator input at 39 and the noise injection node 21. The computational unit 65 outputs a multiplier value that is dependent on the signal level measured at point 63 and is chosen such that the sum of the wanted signal coming from the limiter 15 and the added noise signal do not exceed the saturation level of any of the components that follow, specifically the summing node adder 21, the digital to analogue converter 19, the main amplifier 9 and the receiver transducer 11. The first order recursive filter 65 shown in FIG. 10 comprises a first unit 111 for measuring the absolute signal level. This is followed by a first multiplier 113 which produces at its output a signal that is one sixteenth of original level. This then is added by an adder 115 to a signal that has been delayed one cycle by a delay element 117 and scaled by fifteen sixteenths by a second multiplier 119. The output of this part of the first order recursive filter is then scaled by a preset factor of between one quarter and one sixteenth. The value of this preset scale multiplier may be fixed during manufacture or alternatively may be arranged to be preset by the user during initial set up. Accordingly the noise level can be preset to accomodate a user having either a poor or moderate hearing loss as appropriate.

By cancelling all of the effects of acoustic feedback and not simply inhibiting the onset and occurrence of oscillation, this new technique offers several user benefits:

(i) Inhibition of oscillatory (unstable) response;
(ii) Avoidance of perceivable "ringing effects" noticable at gain settings just below those that cause oscillation;
(iii) Removal of gain dependant perturbations in the frequency response which occur at frequencies far removed from the usual oscillation frequency.

As applied to hearing aids, the invention is intended to allow choice of a wider range of fittings. In particular it is intended to extend the range of availability of vented aids i.e. to allow such aids, particularly those having large diameter vents, to be prescribed where high gain is required in the higher range of audio frequencies.

We claim:

1. In a hearing aid comprising:

a microphone;
a preamplifier responsive to said microphone and producing a preamplified signal;
a main amplifier having an input supplied with an output electrical signal;
a receiver responsive to said main amplifier,
said receiver and said main amplifier having characteristics such that together said receiver and said main amplifier provide a substantially linear acoustic response to the output electrical signal when said output electrical signal has an amplitude within amplifier-receiver upper and lower linearity limits at the input of said main amplifier, and provide a substantially non-linear acoustic response to the output electrical signal when the output electrical signal has an amplitude outside said amplifier-receiver upper and lower linearity limits;
an electrical main pathway, connected between said preamplifier and said main amplifier, said electrical main pathway having a tapping point and a feedback insertion node;
an electrical feedback pathway connected across said electrical main pathway, said electrical feedback pathway extending from said tapping point to said feedback insertion node; and
filter means, inserted in said electrical feedback pathway, said filter means having characteristics which are calculated to model acoustic coupling arising between said receiver and said microphone;
whereby an electrical feedback signal shall be derived by extracting an electrical response signal from said electrical main pathway, passed via said filter means, and applied to said electrical main pathway to compensate for the acoustic coupling;
the improvement comprising:
amplitude limiting means, inserted in said electrical main pathway between said tapping point and said feedback insertion node, for limiting a residual electrical signal applied at its input to an amplitude lying within limiter upper and lower linearity limits in dependence on the amplifier-receiver upper and lower linearity limits so that the output electrical signal at the input of said main amplifier has an amplitude which is within said amplifier-receiver upper and lower linearity limits, and so as to suppress any non-linear acoustic response thereto which otherwise would result in an inadequate cancellation of the effects of acoustic coupling between said receiver and said microphone.

2. The hearing aid according to claim 1 wherein said filter means is an adaptive electrical filter, the hearing aid also comprising:
a noise source, connected to said electrical main pathway by a noise insertion node which is located between said tapping point and said feedback insertion node, to inject continuously an injected noise signal into said receiver; and
adaption control means, cooperative with said adaptive electrical filter, coupled to said noise source to receive said injected noise signal, and coupled to said electrical main pathway at a second tapping point located between said feedback insertion node and said noise insertion node for receiving the residual electrical signal formed of both the preamplified signal and electrical feedback signal as summed, and for correlating said injected noise signal and said residual electrical signal, thereby to adjust adaptively said adaptive electrical filter in dependance upon the electrical response of the hearing aid to the injected noise signal.

3. The hearing aid according to claim 2, wherein:
said amplitude limiting means is located in said electrical main pathway between said second tapping point and said noise insertion node; and wherein:
said limiter upper and lower linearity limits lie within said amplifier-receiver upper and lower linearity limits, and said limiter upper and lower linearity limits differ from said amplifier-receiver upper and lower linearity limits by an amount at least equal to the level of the noise signal.

4. The hearing aid, according to claim 2, wherein said preamplifier is followed by an analog to digital converter;
said main amplifier is preceded by a digital to analog converter; and
said noise source, said amplitude limiting means and said adaptive electrical filter are all digital.

5. The hearing aid, according to claim 4, wherein said adaption control means and said adaptive electrical filter comprise a signal correlator and a finite impulse response filter, respectively.

6. The hearing aid, according to claim 5, wherein said adaptive electrical filter has an adaption rate, and at least one of said noise source and said adaption control means has means for adjusting the adaption rate of the adaptive electrical filter.

7. The hearing aid, according to claim 6, wherein said noise source has means for adjusting the level of the injected noise signal to control said adaption rate.

8. The hearing aid, according to claim 7, wherein said means for adjusting the level of the injected noise signal is connected to said electrical main pathway and is responsive to the residual electrical signal so that the level of the injected noise signal is dependent upon the level of the residual electrical signal.

9. The hearing aid, according to claim 8, wherein said means for adjusting the level of the injected noise signal comprises:
a noise level control means connected between said noise source and said electrical main pathway; and
a first order recursive filter, connected to said electrical main pathway to receive the residual electrical signal, and connected to said noise level control means to control the level of the injected noise signal controlled thereby.

10. The hearing aid, according to claim 2, wherein the noise source comprises a pseudo-random-binary-sequence signal generator.

11. The hearing aid according to claim 4 wherein said noise source comprises:
a pseudo-random-binary-sequence signal generator; and
gate means connected both to an output of said pseudo-random-binary-sequence signal generator and to an output of said analog to digital converter for producing a randomized pseudo-random-binary-sequence noise signal.

12. The hearing aid, according to claim 1, including a molding configured to fit in the ear and having first and second passageways, said second passageway being open at both its ends to provide venting for the ear when said molding is fitted in the ear.

13. In a hearing aid comprising:
a microphone;
a preamplifier responsive to said microphone;

a main amplifier having an input supplied with an output electrical signal;

a receiver responsive to said main amplifier, said receiver and said main amplifier having characteristics such that together said receiver and said main amplifier provide a substantially linear acoustic response to the output electrical signal when said output electrical signal has an amplitude within amplifier-receiver upper and lower linearity limits at the input of said main amplifier, and provide a substantially non-linear acoustic response to the output electrical signal when the output electrical signal has an amplitude outside said amplifier-receiver upper and lower linearity limits;

an electrical main pathway, connected between said preamplifier and said main amplifier, said electrical main pathway having a tapping point and a feedback insertion node;

an electrical feedback pathway connected across said electrical main pathway, said electrical feedback pathway extending from said tapping point to said feedback insertion node; and filter means, inserted in said electrical feedback pathway, said filter means having characteristics which are calculated to model acoustic coupling arising between said receiver and said microphone;

whereby an electrical feedback signal shall be derived by extracting an electrical response signal from said electrical main pathway, passed via said filter means, and applied to said electrical main pathway to compensate for the acoustic coupling;

the improvement comprising:

amplitude limiting means, inserted in said electrical main pathway between said tapping point and said feedback insertion node, for limiting a residual electrical signal applied at its input to an amplitude lying within limiter upper and lower linearity limits in dependence on the amplifier-receiver upper and lower linearity limits so that the output electrical signal at the input of said main amplifier has an amplitude which is within said amplifier-receiver upper and lower linearity limits, and so as to suppress any non-linear acoustic response thereto which otherwise would result in an inadequate cancellation of the effects of acoustic coupling between said receiver and said microphone, said amplitude limiting means being a solitary limiter.

14. The hearing aid, according to claim 13, wherein said limiter has means for adjusting upper and lower limits of the amplitude of said residual electrical signal supplied to an input thereof.

15. The hearing aid, according to claim 14, wherein said limiter has means for externally adjusting the upper and lower limits of the amplitude of the residual electrical signal supplied to said input thereof.

16. In a hearing aid comprising:

a microphone;

a preamplifier responsive to said microphone;

a main amplifier having an input supplied with an output electrical signal;

a receiver responsive to said main amplifier, said receiver and said main amplifier having characteristics such that together said receiver and said main amplifier provide a substantially linear acoustic response to the output electrical signal when said output electrical signal has an amplitude within amplifier-receiver upper and lower linearity limits at the input of said main amplifier, and provide a substantially non-linear acoustic response to the output electrical signal when the output electrical signal has an amplitude outside said amplifier-receiver upper and lower linearity limits;

an electrical main pathway, connected between said preamplifier and said main amplifier, said electrical main pathway having a tapping point and a feedback insertion node;

an electrical feedback pathway connected across said electrical main pathway, said electrical feedback pathway extending from said tapping point to said feedback insertion node; and filter means, inserted in said electrical feedback pathway, said filter means having characteristics which are calculated to model acoustic coupling arising between said receiver and said microphone;

whereby an electrical feedback signal shall be derived by extracting an electrical response signal from said electrical main pathway, passed via said filter means, and applied to said electrical main pathway to compensate for the acoustic coupling;

the improvement comprising:

amplitude limiting means, inserted in said electrical main pathway, between said tapping point and said feedback insertion node, for limiting a residual electrical signal applied at its input so that the output electrical signal at the input of said main amplifier has an amplitude which is within said amplifier-receiver upper and lower linearity limits, so as to suppress any non-linear acoustic response thereto which otherwise would result in an inadequate cancellation of the effects of acoustic coupling between said receiver and said microphone; and manual volume control means located between said amplitude limiting means and said feedback insertion node.

17. In a hearing aid comprising:

a microphone;

a preamplifier responsive to said microphone;

a main amplifier having an input supplied with an output electrical signal;

a receiver responsive to said main amplifier, said receiver and said main amplifier having characteristics such that together said receiver and said main amplifier provide a substantially linear acoustic response to the output electrical signal when said output electrical signal has an amplitude within amplifier-receiver upper and lower linearity limits at the input of said main amplifier, and provide a substantially non-linear acoustic response to the output electrical signal when the output electrical signal has an amplitude outside said amplifier-receiver upper and lower linearity limits;

an electrical main pathway, connected between said preamplifier and said main amplifier, said electrical main pathway having a tapping point and a feedback insertion node;

an electrical feedback pathway connected across said electrical main pathway, said electrical feedback pathway extending from said tapping point to said feedback insertion node; and filter means, inserted in said electrical feedback pathway, said filter means having characteristics which are calculated to model acoustic coupling arising between said receiver and said microphone;

whereby an electrical feedback signal is derived by extracting an electrical response signal from said electrical main pathway, passed via said filter means, and applied to said electrical main pathway to compensate for the acoustic coupling;

the improvement comprising:

amplitude limiting means, inserted in said electrical main pathway between said tapping point and said feedback insertion node, for limiting a residual electrical signal applied at an input thereof to an amplitude lying within limiter upper and lower linearity limits in dependence on the amplifier-receiver upper and lower linearity limits so that the output electrical signal at the input of said main amplifier has an amplitude which is within said amplifier-receiver upper and lower linearity limits, and so as to suppress any non-linear acoustic response thereto which otherwise would result in an inadequate cancellation of the effects of acoustic coupling between said receiver and said microphone; and the acousto-electric gain of said microphone, the gain of said preamplifier, the gain of said main amplifier, and the electro-acoustic gain of said receiver are all such that the hearing aid has an insertion gain which is matched to a predetermined prescriptive requirement.

* * * * *